United States Patent
Yang et al.

(10) Patent No.: US 7,816,284 B2
(45) Date of Patent: Oct. 19, 2010

(54) METHOD OF FORMING PATTERN ON GROUP III NITRIDE SEMICONDUCTOR SUBSTRATE AND METHOD OF MANUFACTURING GROUP III NITRIDE SEMICONDUCTOR LIGHT EMITTING DEVICE

(75) Inventors: Jong In Yang, Gyunggi-do (KR); Yu Seung Kim, Gyunggi-do (KR); Sang Yeob Song, Gyunggi-do (KR); Si Hyuk Lee, Gyunggi-do (KR); Tae Hyung Kim, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/429,458

(22) Filed: Apr. 24, 2009

(65) Prior Publication Data

US 2010/0099212 A1 Apr. 22, 2010

(30) Foreign Application Priority Data

Oct. 16, 2008 (KR) ...................... 10-2008-0101586

(51) Int. Cl.
*H01L 21/00* (2006.01)
(52) U.S. Cl. ...................... 438/795; 438/796; 438/745; 257/E21.328
(58) Field of Classification Search ................. 438/795, 438/796, 745; 257/E21.328
See application file for complete search history.

(56) References Cited

U.S. PATENT DOCUMENTS

2006/0046512 A1 3/2006 Nakamura et al.
2010/0090247 A1* 4/2010 Yang et al. .................. 257/103

FOREIGN PATENT DOCUMENTS

| DE | 10 2009 019 281 A1 | 4/2010 |
|---|---|---|
| JP | 06-049672 | 2/1994 |
| JP | 2006-310657 | 11/2006 |
| KR | 10-2006-0050870 | 5/2006 |

OTHER PUBLICATIONS

Korean Office Action, w/ English translation thereof, issued in Korean Patent Application No. KR 10-2008-0101586 dated Aug. 24, 2010.

* cited by examiner

*Primary Examiner*—Jack Chen
(74) *Attorney, Agent, or Firm*—McDermott Will & Emery LLP

(57) ABSTRACT

There is provided a method of forming a pattern on a group III nitride semiconductor substrate. A method of forming a pattern on a group III nitride semiconductor substrate according to an aspect of the invention may include: irradiating a laser beam onto at least one first region for preventing etching in a group III nitride semiconductor substrate; and etching at least one second region exclusive of the first region using the first region irradiated with the laser beam as a mask.

5 Claims, 6 Drawing Sheets

METHOD OF FORMING PATTERN ON GROUP III NITRIDE SEMICONDUCTOR SUBSTRATE AND METHOD OF MANUFACTURING GROUP III NITRIDE SEMICONDUCTOR LIGHT EMITTING DEVICE

CROSS-REFERENCE TO RELATED APPLICATIONS

This application claims the priority of Korean Patent Application No. 2008-0101586 filed on Oct. 16, 2008, in the Korean Intellectual Property Office, the disclosure of which is incorporated herein by reference.

BACKGROUND OF THE INVENTION

1. Field of the Invention

The present invention relates to a method of forming a pattern on a group III nitride semiconductor substrate and a method of manufacturing a group III nitride semiconductor light emitting device, and more particularly, to a method of forming a pattern on a group III nitride semiconductor substrate that can form a pattern by a simplified process and a method of manufacturing a group III nitride semiconductor light emitting device.

2. Description of the Related Art

In general, group III nitride semiconductor light emitting devices are used to obtain light in the blue or green wavelength. Group III nitride semiconductor light emitting devices are subjected to an etching process to form a grooved pattern to divide the group III nitride semiconductor light emitting device into separate chips or to form an irregular pattern to increase light extraction efficiency. Specifically, in the related art, the etching process may be performed as follows.

First, a mask layer is formed using a metallic material or an oxidized material on the surface of a group III nitride semiconductor light emitting device. Then, the mask layer is coated with a photoresist, and then an exposure process is performed. In the exposure process, a mask having a desired pattern formed thereon can be used.

Then, the photoresist is developed to remove the photoresist on the part exposed to light (or the part not exposed to light). The surface of the group III nitride semiconductor light emitting device or the mask layer exposed by reducing the photoresist is etched to form a pattern. After the pattern is completely formed, the remaining photoresist and the mask layer can be removed.

As described above, a plurality of processes may be required to form a pattern on a group III nitride semiconductor light emitting device, which increases manufacturing costs and time. In particular, when a mask is used to form a pattern, manufacturing costs increase due to the manufacturing of the mask. Therefore, the use of a mask may worsen the above-described problems.

SUMMARY OF THE INVENTION

An aspect of the present invention provides a method of forming a pattern on a group III nitride semiconductor substrate and a method of manufacturing a group III nitride semiconductor light emitting device that can use a simplified process by performing an etching process using a region irradiated with a laser beam on a group III nitride semiconductor substrate.

According to an aspect of the present invention, there is provided a method of forming a pattern on a group III nitride semiconductor substrate, the method including: irradiating a laser beam onto at least one first region for preventing etching in a group III nitride semiconductor substrate; and etching at least one second region exclusive of the first region using the first region irradiated with the laser beam as a mask.

The group III nitride semiconductor substrate may include a first surface having nitrogen polarity and a second surface having group III polarity and opposing the first surface.

The at least one first region and the at least one second region may be located on the first surface of the group III nitride semiconductor substrate, and the polarity of the first region may be converted into group III polarity by the laser irradiation.

The group III nitride semiconductor substrate may include a semiconductor having a composition represented by $Al_xIn_yGa_{(1-x-y)}N$ ($0 \leq x \leq 1$, $0 \leq y \leq 1$ and $0 \leq x+y \leq 1$).

The etching of the at least one second region may be performed by wet etching using any one material of KOH, $H_2SO_4$ and $H_3PO_4$.

According to another aspect of the present invention, there is provided a method of manufacturing a group III nitride semiconductor light emitting device, the method including: growing a light emitting structure having a first group III nitride semiconductor layer, an active layer and a second group III nitride semiconductor layer on a nitride single crystal growth substrate; forming a support substrate to support the light emitting structure on the second group III nitride semiconductor layer; removing the nitride single crystal growth substrate from the light emitting structure; irradiating a laser beam onto at least one first region for preventing etching in the light emitting structure exposed by removing the nitride single crystal growth substrate; and etching at least one second region exclusive of the first region using the first region irradiated with the laser beam as a mask.

The light emitting structure may include a first surface corresponding to one surface of the first group III nitride semiconductor layer and having nitrogen polarity, and a second surface opposing the first surface corresponding to one surface of the second group III nitride semiconductor layer and having group III polarity.

The at least one region and the at least second region may be located on the first surface of the light emitting structure, and the polarity of the first region may be converted into group III polarity by the laser irradiation.

The etching of the at least one second region may include forming an irregular pattern for light extraction by etching the second region up to a part of the first group III nitride semiconductor layer.

The etching of the at least one second region may include forming a grooved pattern used to separate the light emitting structure into devices by etching the second region from the first group III nitride semiconductor layer to a predetermined depth below the second group III nitride semiconductor layer.

The nitride single crystal growth substrate may be formed of a material selected from the group consisting of sapphire, SiC, Si, ZnO, $MgAl_2O_4$, MgO, $LiAlO_2$ and $LiGaO_2$.

Each of the first group III nitride semiconductor layer, the active layer and the second group III nitride semiconductor layer may include a semiconductor having a composition represented by $l_xIn_yGa_{(1-x-y)}N$ ($0 \leq x \leq 1$, $0 \leq y \leq 1$ and $0 \leq x+y \leq 1$).

The etching of the at least second region may be performed by wet etching using any one material of KOH, $H_2SO_4$ and $H_3PO_4$.

The method may further include: forming a first electrode on the first region irradiated with the laser beam; and forming a second electrode on the support substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
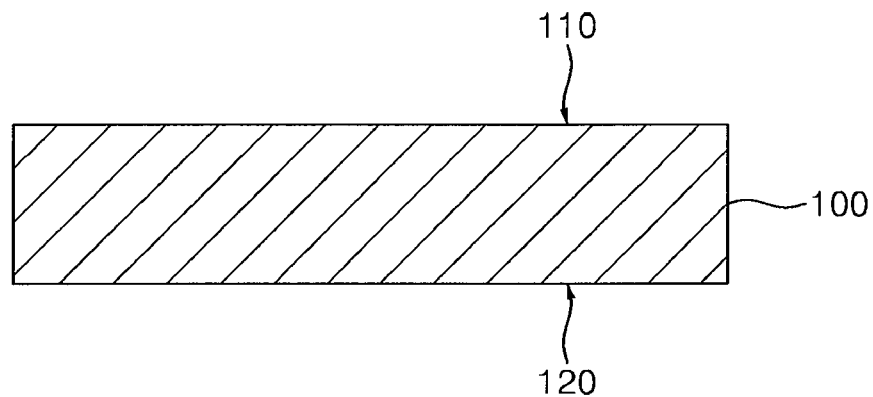
FIGS. 1A through 1C are views illustrating a method of forming a pattern on a group III nitride semiconductor substrate according to an exemplary embodiment of the present invention.
Figure 1B:
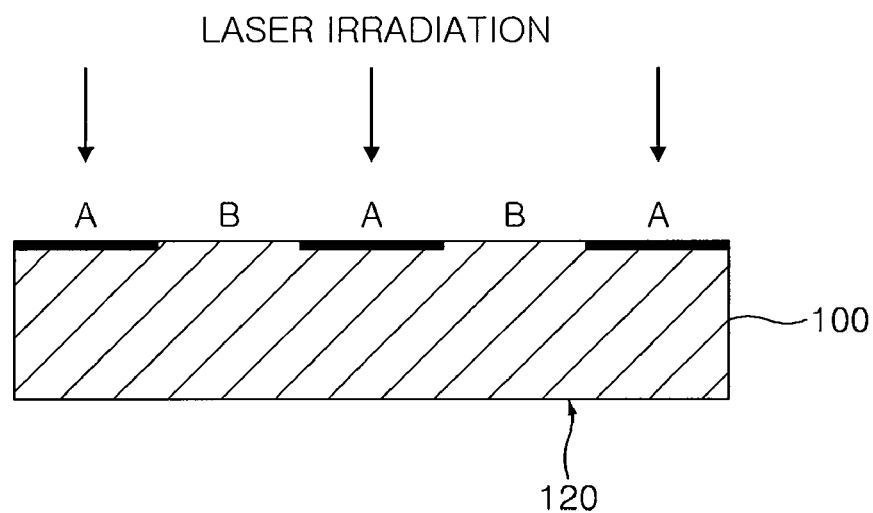
Figure 1C:
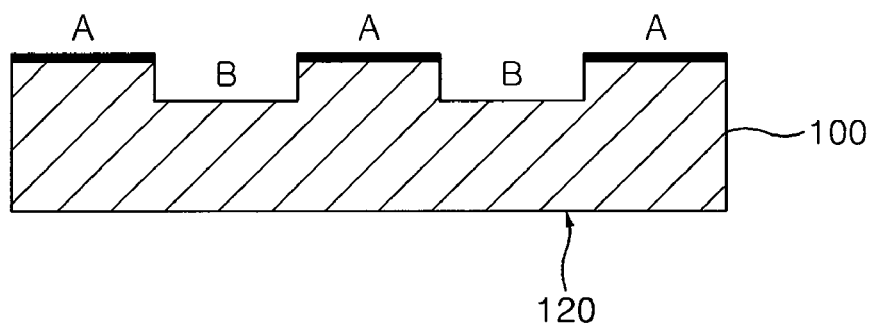

FIGS. 1A through 1C are views illustrating a method of manufacturing a pattern on a group III nitride semiconductor substrate according to an exemplary embodiment of the invention. First, as shown in FIG. 1A, a group III nitride semiconductor substrate 100 is provided. Specifically, the group III nitride semiconductor substrate 100 may be manufactured by growing a group III nitride semiconductor layer on a growth substrate (not shown) and then removing the growth substrate. Here, a sapphire substrate or an SiC substrate may be used as the growth substrate.

The group III nitride semiconductor substrate 100 may be a single crystal substrate that is formed of a semiconductor having a composition represented by $Al_xIn_yGa_{(1-x-y)}N$ ($0 \leq x \leq 1$, $0 \leq y \leq 1$ and $0 \leq x+y \leq 1$).

The group III nitride semiconductor substrate 100 includes a second surface 120 that opposes a first surface 110. Here, the first surface 110 has nitrogen polarity and the second surface 120 has group III polarity. Specifically, the group III element and the nitrogen of the group III nitride semiconductor substrate 100 have a Wurtzite crystal structure. While nitrogen elements are arranged on the first surface 110, group III elements are arranged on the second surface 120. That is, the polarity of each of the first surface 110 and the second surface 120 is determined according to the elements arranged thereon.

The process of forming a pattern on the group III nitride semiconductor substrate 100 will now be described in detail.

Referring to FIG. 1B, a laser beam is irradiated on the first surface 110 having nitrogen polarity in the group III nitride semiconductor substrate 100. Specifically, according to the pattern shape, one or more first regions A for preventing etching and one or more second regions B for performing an etching process are determined on the first surface 110. The laser beam is irradiated onto the first regions A that are used to prevent etching.

In the group III nitride semiconductor substrate 100, the difference in polarity between the first and second surfaces 110 and 120 causes the difference in etching characteristics therebetween. Specifically, it is possible to etch the first surface 110, having nitrogen polarity, while it is difficult to etch the second surface 120 having group III polarity. Therefore, the first surface 110 having nitrogen polarity is preferably etched to form a pattern using an etching process. Therefore, as the first and second regions A and B are determined on the first surface 110, and a laser beam is irradiated onto the first regions A, the first regions A are subjected to surface treatment.

Here, before irradiating a laser beam onto the first region A, nitrogen vacancies are formed in the surface of the first region A by plasma treatment or ion beam irradiation, and thus, the group III elements and the nitrogen elements are irregularly arranged. For example, the surface of the first region A may have an amorphous structure or polycrystal structure or may be under group III-rich conditions due to plasma treatment or ion beam irradiation.

Then, the first region A can be subjected to surface treatment by irradiating a laser beam onto the first region A, so that the polarity of the first region A is converted into group III polarity. Specifically, the group III elements and the nitrogen elements that have been irregularly arranged in the first regions A are re-crystallized, such that the group III elements are arranged on the first region A by laser irradiation. This occurs because arranging the group III elements on the surface is more stable than arranging the nitrogen elements on the surface. While the group III elements and the nitrogen elements are irregularly arranged, if a laser beam is irradiated, the group III elements, having a relatively stable crystal structure, are arranged on the first regions A. As a result, the first surface 110 includes the first regions A whose polarity has been converted into group III polarity and the second regions B having nitrogen polarity. That is, two polarities exist at the same time on one surface.

The lasers used for surface treatment in this embodiment may include at least one laser of a 193-nm excimer laser, a 248-nm excimer laser, a 308-nm excimer laser, a Nd:YAG laser, a He—Ne laser, or an Ar ion laser. Further, in addition to laser irradiation, a method of re-arranging group III elements and nitrogen elements that have been irregularly arranged in the first region A by applying predetermined thermal energy may be used. For example, an ion beam or annealing may be used.

Then, the group III nitride semiconductor substrate 100, shown in FIG. 1B, is etched to form a pattern. Specifically, a wet etching process using any one material of KOH, $H_2SO_4$ and $H_3PO_4$ is performed on the first surface 110 that includes the first regions A having group III polarity and the second regions B having nitrogen polarity in the group III nitride semiconductor substrate 100. Here, since the first region A having group III polarity does not react to etchants, it is used as a mask during etching. On the other hand, the second regions B, having nitrogen polarity, react to etchants and thus are etched. Therefore, the second regions B are only etched to thereby form a pattern as shown in FIG. 1C.

As described above, in the embodiment of the invention, patterns are not formed by performing an exposure process using a photoresist and an etching process, rather patterns are formed on the group III nitride semiconductor substrate 100 simply by performing laser irradiation and etching. When compared to the related art, patterns can be formed using a simplified process to thereby reduce manufacturing time and costs.

Figure 2A:
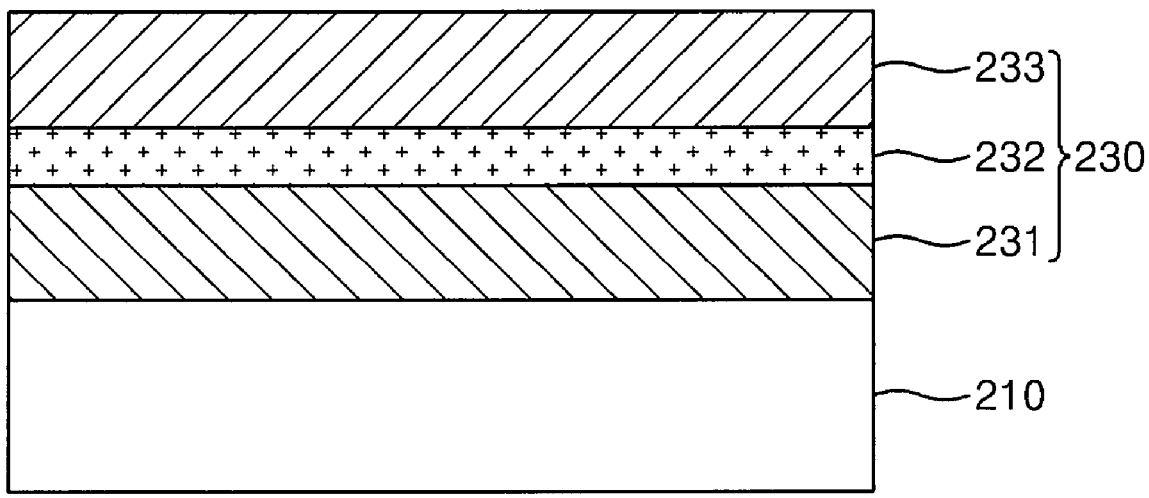
FIGS. 2A through 2F are views illustrating a method of manufacturing a group III nitride semiconductor light emitting device according to an exemplary embodiment of the present invention.

FIGS. 2A through 2F are views illustrating a method of manufacturing a group III nitride semiconductor light emitting device according to an exemplary embodiment of the invention. Referring to FIG. 2A, a light emitting structure 230 including a first group III nitride semiconductor layer 231, an active layer 232 and a second group III nitride semiconductor layer 233 is formed on a nitride single crystal growth substrate 210. Here, the nitride single crystal growth substrate 210 is formed of a material selected from the group consisting of sapphire, SiC, Si, ZnO, $MgAl_2O_4$, MgO, $LiAlO_2$ and $LiGaO_2$. Further, the first group III nitride semiconductor layer 231, the active layer 232 and the second group III nitride semiconductor layer 233 may be grown using any one method of MOCVD, HVPE and MBE.

Each of the first group III nitride semiconductor layer 231, the active layer 232, and the second group III nitride semiconductor layer 233, shown in FIG. 2A, is formed of a semiconductor having a composition represented by $Al_xIn_yGa_{(1-x-y)}N$ ($0 \leq x \leq 1$, $0 \leq y \leq 1$ and $0 \leq x+y \leq 1$), and has a crystal structure in which nitrogen elements and one or more group III elements including aluminum (Al), indium (In) and gallium (Ga) are bonded together in a predetermined arrangement.

Figure 2B:
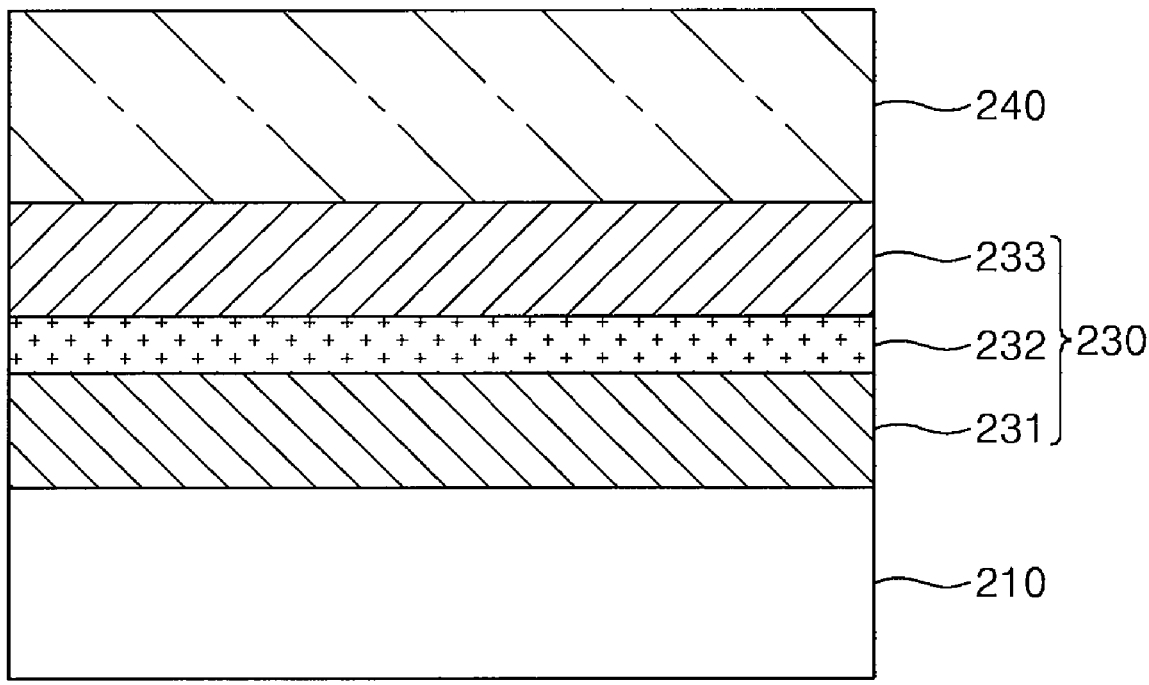
Figure 2C:
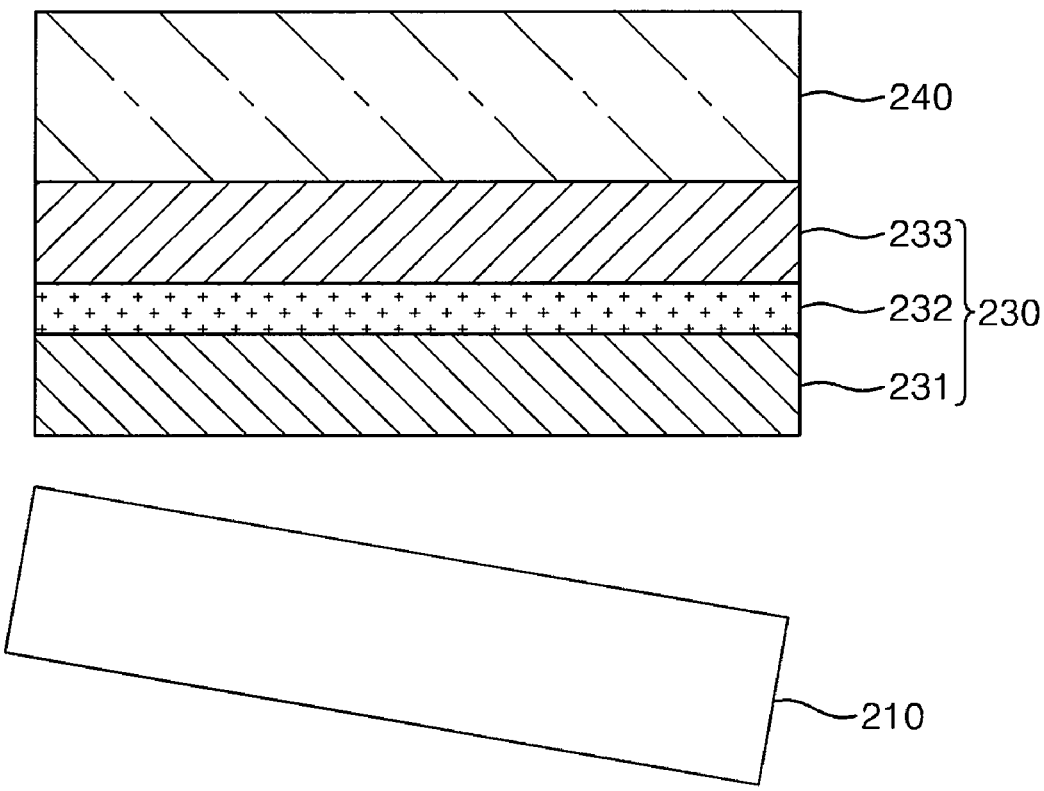

Then, as shown in FIG. 2B, a support substrate 240 is formed on the light emitting structure 230. Here, the support substrate 240 supports the light emitting structure 230. A conductive substrate (for example, a silicon substrate or a metal substrate) may be used. Then, as shown in FIG. 2C, the nitride single crystal growth substrate 210 is separated from the light emitting structure 230 by laser lift-off. As a result, as shown in FIG. 2D, the support substrate 240 supports the light emitting structure 230.

Figure 2D:
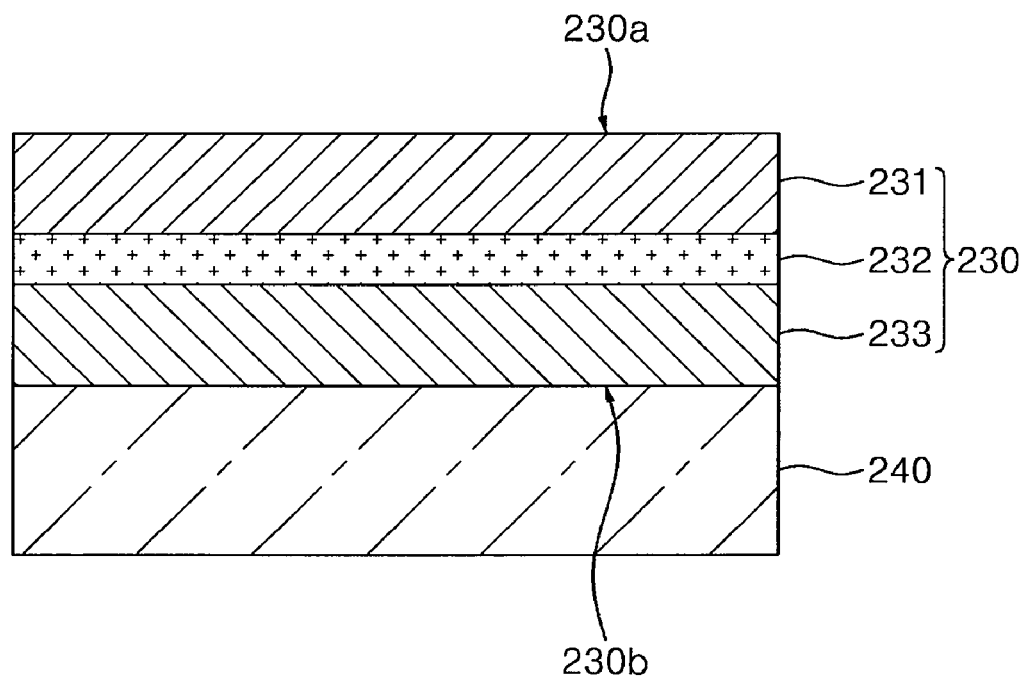

In FIG. 2D, the light emitting structure 230 includes a first surface 230a and a second surface 230b. Here, the first surface 230a corresponds to one surface of the first group III nitride semiconductor layer 231, which is exposed due to the separation of the nitride single crystal growth substrate 210, and has nitrogen polarity. Further, the second surface 230b opposes the first surface 230a, corresponds to one surface of the second group III nitride semiconductor layer 233, which makes contact to the support substrate 240, and has group III polarity. That is, nitrogen elements are arranged on the first surface 230a, while group III elements are arranged on the second surface 230b.

Figure 2E:
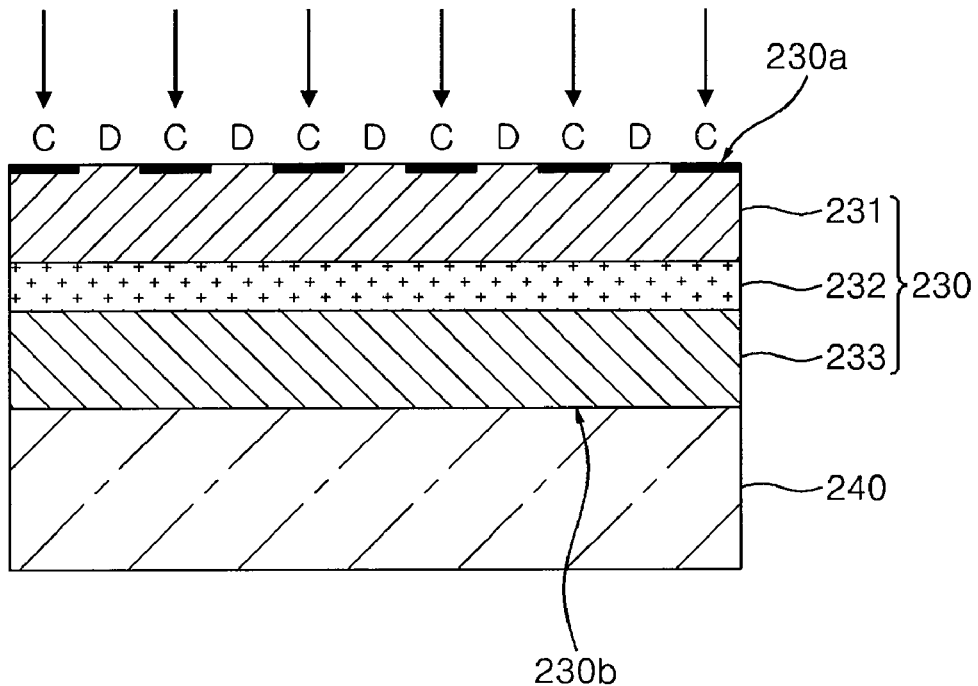

Then, as shown in FIG. 2E, a laser beam is irradiated onto the first surface 230a, having nitrogen polarity in the light emitting structure 230. The first surface 230a, corresponding to the first group III nitride semiconductor layer 231, is a light emitting surface from which light, generated from the active layer 232, is emitted to the outside. An irregular pattern is formed on the first surface 230a to increase light extraction efficiency. To this end, as shown in FIG. 2E, a laser beam is irradiated onto the first surface 230a of the light emitting structure 230. Specifically, according to the shape of an irregular pattern, one or more first regions C for etching prevention and one or more second regions D for performing etching are determined on the first surface 230a. A laser beam is irradiated onto the first regions C determined to prevent etching.

Since it is difficult to etch the second surfaces 230b having group III polarity in the light emitting structure 230, the first surfaces 230a having nitrogen polarity are preferably etched. Therefore, the first and second regions C and D are determined on the first surface 230a, and a laser beam is irradiated onto the first regions C, determined to prevent etching. Here, before irradiating a laser beam onto the first region C, the surface of the first region C is subjected to pretreatment to cause an irregular arrangement of group III elements and nitrogen elements so that the first region C may have an amorphous structure, a polycrystal structure or be under group III-rich conditions due to plasma treatment or ion beam irradiation.

By irradiating a laser beam onto the first region C, the first region C has group III polarity. While the group III elements and the nitrogen elements are irregularly arranged in the first region C, if a laser beam is irradiated, the group III elements having a relatively stable crystalline structure become arranged on the first regions A.

Then, the first surface 230a of the light emitting structure 230 subjected to laser irradiation is etched to form a pattern. Specifically, a wet etching process is performed on the first surface 230a that has the first regions C having group III polarity and the second regions D having nitrogen polarity in the light emitting structure 230. Here, while the first region C, having group III polarity, does not react to etchants, the second regions D, having nitrogen polarity, react to etchants and thus are etched. As a result, only the second regions D are etched to thereby form an irregular pattern on a light extraction surface of the light emitting structure 230. To this end, preferably, the first surface 230a of the light emitting structure 230 is etched to a predetermined depth on the first group III nitride semiconductor layer 231 that provides the first surface 230a.

Figure 2F:
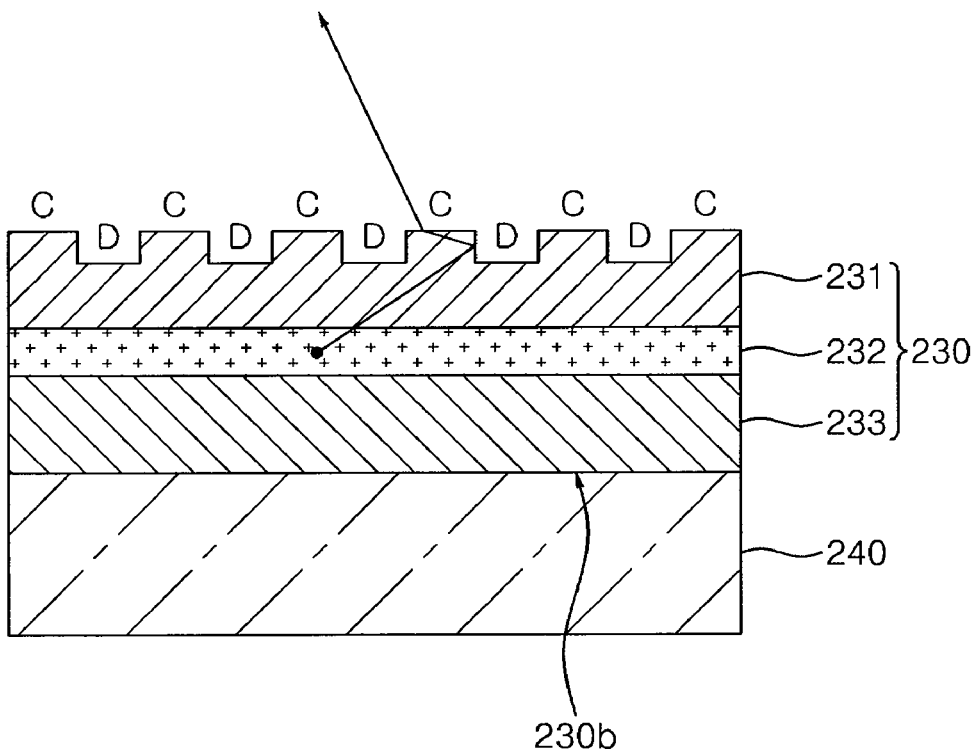

As shown in FIG. 2F, as the irregular pattern is formed on the light extraction surface of the light emitting structure 230, light, generated from the active layer 232, moves into the first nitride semiconductor layer 231 and reaches the irregular pattern. Here, even when the total reflection of light occurs at the light emitting surface, light may be reflected again inside the irregular pattern and can be extracted to the outside.

As shown in FIGS. 2A through 2F, the irregular pattern, formed to increase light extraction efficiency, can be formed using a simple process merely by laser irradiation and etching.

Though not shown in the drawings, in the group III nitride semiconductor light emitting device, shown in FIG. 2F, a first electrode may be formed on a region of the first nitride semiconductor layer 231 that is subjected to surface treatment, that is, the first region C, and a second electrode may be formed on the lower side of the support substrate 240.

Table 1 shows the results of measuring the electrical characteristics of group III nitride semiconductor light emitting devices that are manufactured according to inventive examples and comparative examples. Specifically, the group III nitride semiconductor light emitting devices according to the inventive examples are manufactured using the method, illustrated in FIGS. 2A through 2F. In each of the group III nitride semiconductor light emitting devices, an electrode (not shown) is formed on the first region C, which has group III polarity, on the irregular pattern of the first group III nitride semiconductor layer 231.

The group III nitride semiconductor light emitting devices according to the comparative examples have the same configuration as the group III nitride semiconductor light emitting device, shown in FIG. 2F. However, an irregular pattern is not formed by surface treatment through laser irradiation but formed by forming a mask layer, applying a photoresist, performing exposure, performing development and performing etching. That is, the projecting portions and recessed portions of the irregular pattern have the same nitrogen polarity. Here, in the group III nitride semiconductor light emitting devices according to the comparative examples, electrodes are also formed on the projecting portions of the irregular pattern.

TABLE 1

| classification | | Comparative examples | Inventive examples |
|---|---|---|---|
| Voltage at 350 mA [V] | Maximum value | 4.09 | 3.49 |
| | Average value | 3.84 | 3.42 |
| | Minimum value | 3.73 | 3.36 |
| | Standard deviation | 0.101 | 0.032 |

As one hundred samples of group III nitride semiconductor light emitting devices manufactured according to inventive examples and one hundred samples of group III nitride semiconductor light emitting devices manufactured according to comparative examples were prepared, the voltage characteristics of the samples were compared with each other. For convenience of explanation, the maximum value, the average value, the minimum value and the standard deviation of the samples according to the inventive examples and the comparative examples are only shown in Table 1.

With reference to Table 1, the inventive examples in which electrodes were formed on the first regions C, whose polarity is converted into group III polarity, of the first group III nitride semiconductor layer 231 by laser irradiation were different from the comparative examples in which electrodes are formed on the regions having nitrogen polarity in terms of voltages. That is, the light emitting device samples according to the comparative examples generated an average voltage of 3.84V, a maximum voltage of 4.09V and a minimum voltage of 3.73V at a current of 350 mA. The standard deviation of these samples was approximately 0.101V at the current of 350 mA.

On the other hand, the light emitting device samples according to the inventive examples generated an average voltage of 3.42V, a maximum voltage of 3.49V and a minimum voltage of 3.36V at the current of 350 mA. The standard deviation of these samples was approximately 0.032V. When compared to the light emitting device samples according to the comparative examples, the light emitting device samples according to the inventive examples generated the reduced voltages.

Therefore, when the electrodes are formed on the regions having group III polarity like the inventive examples, the electrical characteristics of the light emitting device were shown to be improved.

Figure 3A:
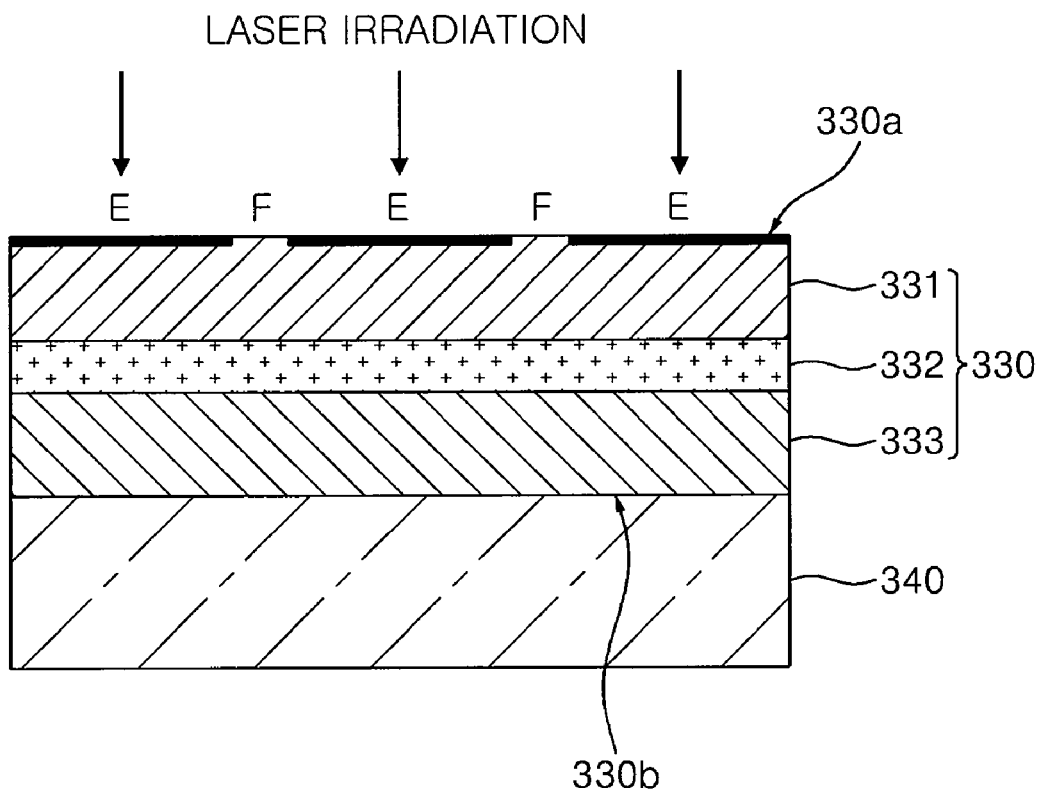
FIGS. 3A and 3B are views illustrating a method of manufacturing a group III nitride semiconductor light emitting device according to another exemplary embodiment of the present invention.
Figure 3B:
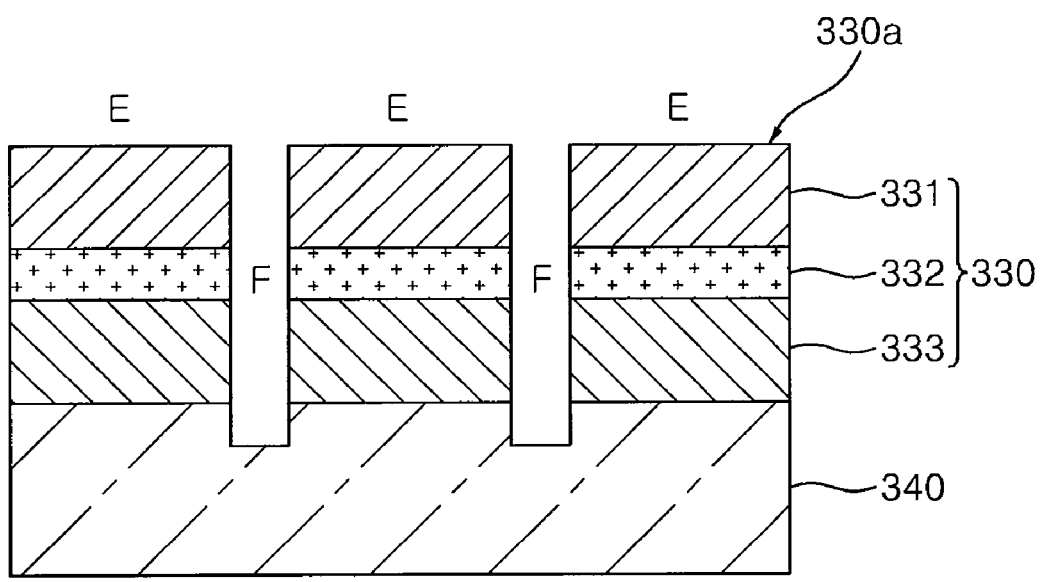

FIGS. 3A and 3B are views illustrating a method of manufacturing a group III nitride semiconductor light emitting device according to another exemplary embodiment of the invention. In FIGS. 3A and 3B, a method of forming a grooved pattern is provided to divide a light emitting device into separate chips. Here, a light emitting device, shown in FIG. 3A, may be manufactured using the same method as shown in FIGS. 2A through 2F. Specifically, a light emitting structure 330 is formed on a nitride single crystal growth substrate. The light emitting structure 330 includes a first group III nitride semiconductor layer 331, an active layer 332 and a second group III nitride semiconductor layer 333. Then, a support substrate 340 is formed on the light emitting structure 330, thereby manufacturing the light emitting device, shown in FIG. 3A.

The light emitting structure 330 of the light emitting device, shown in FIG. 3A, includes a first surface 330a corresponding to one surface of the first group III nitride semiconductor layer 331, and a second surface 330b corresponding to one surface of the second group III nitride semiconductor layer 333. Here, the first surface 330a may have nitrogen polarity, and the second surface 330b may have group III polarity.

Then, in order to form a grooved pattern, a laser beam is irradiated onto the first surface 330a, having nitrogen polarity in the light emitting structure 330. Specifically, first regions E for preventing etching and second regions F for performing etching are determined on the first surface 330a, and then a laser beam is only irradiated onto the first regions E. As a result, the polarity of the first regions E on the first surface 330a, having nitrogen polarity, is converted into group III polarity.

Then, as shown in FIG. 3B, the first surface 330a of the light emitting structure 330 is etched using etchants. In this process, the first regions E having group III polarity do not react to the etchants, and thus only the second regions F are etched. Accordingly, as shown in FIG. 3B, a grooved pattern is formed to separate the light emitting device into chips. To this end, the second regions F on the first surface 330a are etched from the surface of the first group III nitride semiconductor layer 331 to a predetermined depth below the second group III nitride semiconductor layer 333 through the active layer 332. Here, the etching degree (depth) of the second region F may be controlled according to etching time.

Though not directly illustrated in the nitride semiconductor light emitting device, shown in FIG. 3B, first electrodes may be formed on the first regions E, subjected to surface treatment, on the first group III nitride semiconductor layer 331, and second electrodes may be formed on the support substrate 340.

Figure 4:
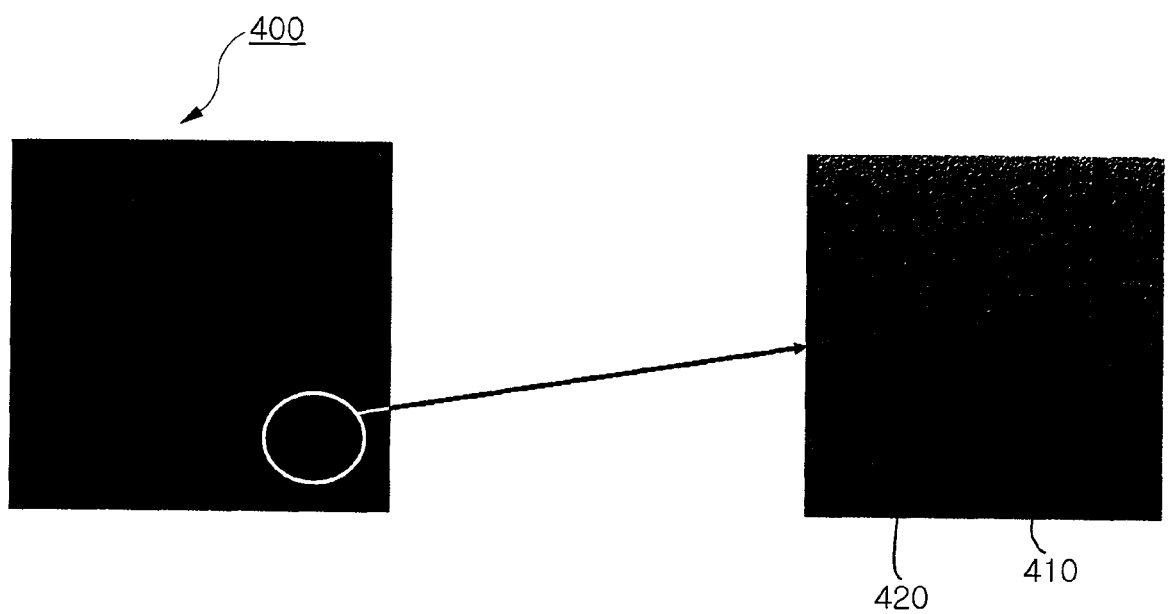
FIG. 4 is a photograph created by capturing the surface of a group III nitride semiconductor light emitting device manufactured by a method according to an exemplary embodiment of the present invention.

FIG. 4 is a photograph created by capturing the surface of a group III nitride semiconductor light emitting device manufactured by a method according to an exemplary embodiment of the invention. The photograph, shown in FIG. 4, is produced by capturing the surface of a group III nitride semiconductor light emitting device 400 that is manufactured by the same method as shown in FIGS. 2A through 2F.

An irregular pattern is formed on the surface of the group III nitride semiconductor light emitting device 400. The irregular pattern may be formed by laser irradiation and etching. Specifically, referring to an enlarged view showing part of the surface of the group III nitride semiconductor light emitting device 400, parts onto which a laser beam is not irradiated are etched to form a recessed portion 420, and other parts onto which a laser beam is irradiated are not etched to form a projecting portion 410. That is, the irregular pattern can be formed by laser irradiation and etching, which facilitates a process of forming a pattern on a light emitting device.

As set forth above, according to exemplary embodiments of the invention, a laser beam is irradiated onto a first region for preventing etching on a group III nitride semiconductor substrate, and the first region is used as a mask during etching. Therefore, a pattern can be formed on the group III nitride semiconductor substrate simply by laser irradiation and etching, which facilitates a process of forming a pattern. Accordingly, processing time and costs can be reduced when forming a grooved pattern used to divide a group III nitride semiconductor light emitting device into separate chips or an irregular pattern used to improve light extraction efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of forming a pattern on a group III nitride semiconductor substrate, the method comprising:
    irradiating a laser beam onto at least one first region for preventing etching in a group III nitride semiconductor substrate; and
    etching at least one second region exclusive of the first region using the first region irradiated with the laser beam as a mask.

2. The method of claim 1, wherein the group III nitride semiconductor substrate comprises a first surface having nitrogen polarity and a second surface having group III polarity and opposing the first surface.

3. The method of claim 2, wherein the at least one first region and the at least one second region are located on the first surface of the group III nitride semiconductor substrate, and the polarity of the first region is converted into group III polarity by the laser irradiation.

4. The method of claim 1, wherein the group III nitride semiconductor substrate comprises a semiconductor having a composition represented by $Al_xIn_yGa_{(1-x-y)}N$ ($0 \leq x \leq 1$, $0 \leq y \leq 1$ and $0 \leq x+y \leq 1$).

5. The method of claim 1, wherein the etching of the at least one second region is performed by wet etching using any one material of KOH, $H_2SO_4$ and $H_2PO_4$.

* * * * *